(12) United States Patent
Shim et al.

(10) Patent No.: US 6,470,465 B1
(45) Date of Patent: Oct. 22, 2002

(54) PARALLEL TEST CIRCUIT OF SEMICONDUCTOR MEMORY DEVICE

(75) Inventors: Young Bo Shim, Seoul (KR); Jong Kyeong Shin, Ichon-shi (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/472,608

(22) Filed: Dec. 27, 1999

(30) Foreign Application Priority Data

Dec. 30, 1998 (KR) .............................. 98-61921

(51) Int. Cl.[7] .............................................. G11C 29/00
(52) U.S. Cl. ....................................... 714/718; 714/724
(58) Field of Search ............................. 326/28; 327/53, 327/333; 714/724, 718, 742

(56) References Cited

U.S. PATENT DOCUMENTS

| 5,285,419 A | | 2/1994 | Iyengar |
| 5,301,142 A | | 4/1994 | Suzuki et al. |
| 5,305,266 A | | 4/1994 | Rountree |
| 5,311,473 A | | 5/1994 | McClure et al. |
| 5,450,019 A | * | 9/1995 | McClure et al. ............... 326/28 |
| 5,506,522 A | * | 4/1996 | Lee ............................. 327/53 |
| 5,543,744 A | * | 8/1996 | Okumura ..................... 327/333 |
| 5,617,366 A | | 4/1997 | Yoo |
| 5,677,881 A | | 10/1997 | Seo et al. |
| 5,680,069 A | * | 10/1997 | Okumura ..................... 327/333 |
| 5,896,324 A | | 4/1999 | Jang et al. |
| 6,381,718 B1 | * | 4/2002 | Brown et al. ................ 714/724 |
| 6,408,411 B1 | * | 6/2002 | Brown et al. ................ 714/724 |

FOREIGN PATENT DOCUMENTS

| EP | 9472266 A2 | 2/1992 |
| EP | 0615252 A2 | 9/1994 |
| EP | 0786780 A1 | 7/1997 |
| KR | 1993-20453 | 10/1993 |
| KR | 1998-014992 | 5/1998 |

* cited by examiner

Primary Examiner—David Ton
(74) Attorney, Agent, or Firm—Jacobson Holman PLLC

(57) ABSTRACT

A parallel test circuit for a semiconductor memory device includes a divided output driver configuration capable of generating a tri-state output. The parallel test circuit has a main output driver for outputting a signal having a first level when cell arrays are stored with data having the same level, and a sub output driver for outputting a signal having an intermediate level when the cell arrays are stored with data having different levels. Because the parallel test circuit can accurately detect errors, it can perform a reliable parallel test for pass/fail devices, and can be used to check device characteristics or for a speed sort test.

8 Claims, 14 Drawing Sheets

| A | B | DOUT | Note |
|---|---|---|---|
| 0 | 0 | 1(Pass) | 1 : High Level |
| 0 | 1 | 0(Fail) | |
| 1 | 0 | 0(Fail) | 0 : Low Level |
| 1 | 1 | 1(Pass) | |

Fig.2
(prior art)

| A | B | DOUT |
|---|---|------|
| 0 | 0 | 0 |
| 0 | 1 | Low-z |
| 1 | 0 | Low-z |
| 1 | 1 | 1 |

Fig.4

| A | B | main driver | | sub driver | DOUT |
|---|---|---|---|---|---|
| | | PMB1 | NMB1 | PMB2 | |
| 0 | 0 | off | on | off | 0 |
| 0 | 1 | off | off | on | 1/2 Vcc |
| 1 | 0 | off | off | on | 1/2 Vcc |
| 1 | 1 | on | off | off | 1 |

Fig.6

| A | B | main driver | | sub driver | | DOUT |
|---|---|---|---|---|---|---|
| | | PMC1 | NMC1 | PMC2 | NMC2 | |
| 0 | 0 | off | on | off | on | 0 |
| 0 | 1 | off | off | on→off | on→off | Low-z → floating |
| 1 | 0 | off | off | on→off | on→off | Low-z → floating |
| 1 | 1 | on | off | on | off | 1 |

Fig.9

| A | B | main driver | | sub driver | DOUT |
|---|---|---|---|---|---|
| | | PMD1 | NMD1 | PMD2 | |
| 0 | 0 | off | on | off | 0 |
| 0 | 1 | off | off | on→off | 1/2 Vcc → floating |
| 1 | 0 | off | off | on→off | 1/2 Vcc → floating |
| 1 | 1 | on | off | off | 1 |

Fig.11

| A | B | main driver | | DOUT State | sub driver | | DOUT |
|---|---|---|---|---|---|---|---|
| | | PME1 | NME1 | | PME2 | NME2 | |
| 0 | 0 | off | on | Don't Care | off | off | 0 |
| 0 | 1 | off | off | H | off | on→off | Hi-z |
| | | | | L | on→off | off | |
| 1 | 0 | off | off | H | off | on→off | Hi-z |
| | | | | L | on→off | off | |
| 1 | 1 | on | off | Don't Care | off | off | 1 |

Fig.13

PARALLEL TEST CIRCUIT OF SEMICONDUCTOR MEMORY DEVICE

BACKGROUND OF THE INVENTION

1. Field of the Invention

The present invention relates to a parallel test circuit of a semiconductor memory device, and more particularly to a parallel test circuit of a semiconductor memory device which has a divided output driver configuration capable of achieving an accurate parallel test.

2. Description of the Prior Art

Semiconductor memory devices, which may be dynamic random access memories (DRAMs), have been rapidly improved to have an increased density. Recently, semiconductor devices themselves have been developed to have an ultra-high density up to a degree that several ten million cells are included in one semiconductor device. Meanwhile, it is very important to test whether cells are normal or abnormal. This test should not only be accurately conducted, but also be rapidly achieved. In order to meet such requirements, a parallel test method has been proposed in which a simultaneous multi-bit access can be achieved. This parallel test method has been commonly used in the technical field to which the present invention pertains. In order to reduce the test time, most DRAMs are equipped with parallel test circuits.

Referring to FIG. 1, a conventional parallel test circuit is illustrated. As shown in FIG. 1, the parallel test circuit includes a data input pad DIN, to which data to be written is inputted, and a pair of cell arrays, that is, a first cell array 2A and a second cell array 2B, each consisting of a plurality of memory cells each adapted to store the data inputted to the data input pad DIN. Also, there is an output driver 8 which is switched, in accordance with respective data A and B stored in the first and second cell arrays 2A and 2B, between a normal mode, in which it outputs the stored data A and B, and a test mode in which it outputs a signal having a high or low level selected on the basis of the levels of the stored data A and B. The parallel test circuit also includes a first switch SW1 for selectively coupling the input data from the data input pad DIN to a normal path or a test path, a second switch SW2 for selectively coupling the data inputted via the normal path to the first cell array 2A or second cell array 2B in the normal mode, and a third switch SW3 for selectively outputting the first data A stored in the first cell array 2A or the second data B stored in the second cell array 2B via the normal path in the normal mode. The parallel test circuit further includes an inverter INV1 for inverting the data selectively outputted in accordance with a switching operation of the third switch SW3, an output driver control unit 4 for outputting a first output driver driving signal DR1 and a second output driver driving signal DR2 adapted to control an output driver 8 in the test mode, based on the data A and B from the first and second cell array 2A and 2B, respectively, and a fourth switch SW4 for selectively coupling the data selectively outputted in accordance with the switching operation of the third switch SW3 or the first output driver driving signal DR1 from the output driver control unit 4 to the output driver 8. The parallel test circuit also includes a fifth switch SW5 for selectively coupling the output from the first inverter INV1 or the second output driver driving signal DR2 from the output driver control unit 4 to the output driver 8, and a data output pad DOUT for externally outputting the output from the output driver 8 when the data is to be read.

The output driver control unit 4 includes an exclusive NOR gate XNOR for exclusively NORing the output data A and B from the first and second cell arrays 2A and 2B, and a second inverter INV2 for inverting the output from the exclusive NOR gate XNOR, thereby outputting the inverted signal as the second output driver driving signal DR2.

The output driver 8 includes a pair of NMOS transistors NM1 and NM2 coupled in series between a supply voltage Vcc and a ground voltage Vss. The first NMOS transistor NM1 receives, at its gate, the signal selectively outputted via the second switch SW2 whereas the second NMOS transistor NM2 receives, at its gate, the signal selectively outputted via the third switch SW3. The node between the first and second NMOS transistors NM1 and NM2 is coupled to the data output pad DOUT, so that an output signal thereon is outputted to the data output pad DOUT.

The conventional parallel test circuit having the above mentioned configuration operates in such a method that it outputs a signal having a logic 'high' level when cells, which are parallel-accessed, are stored with the same data while outputting a logic 'low' level when those cells are stored with different data, respectively. When the parallel test circuit outputs a signal having a logic 'high' level, the semiconductor device tested by the parallel test circuit is regarded as to have passed. On the other hand, when the parallel test circuit outputs a signal having a logic 'low' level, the semiconductor device is regarded as to have failed.

FIG. 2 is a truth table for the parallel test mode of the conventional parallel test circuit shown in FIG. 1. As shown in FIG. 2, where respective output data A and B of the first and second cell array 2A and 2B are identical to each other, a signal having a value of '1', namely, a logic 'high' level, is output from the data output pad DOUT of the parallel test circuit in a read mode. Where the output data A and B of the first and second cell array 2A and 2B are different from each other, a signal having a value of '0', namely, a logic 'low' level, is output from the data output pad DOUT.

However, where all of parallel-accessed cells have the same data, various problems may occur in the above mentioned conventional parallel test circuit because an output having a 'high' level is always generated in this state, irrespective of the value of the data. For instance, although the first and second cell arrays 2A and 2B of FIG. 1, which are parallel-accessed to be written with data of '1', are erroneously stored with data of '0', an output of a 'high' level is generated in accordance with the conventional parallel test method. Due to the 'high'-level output, the associated semiconductor device is erroneously detected to be passed. In other words, the test operation of the parallel test circuit itself is erroneously conducted. Thus, the conventional parallel test method using the configuration of FIG. 1 cannot detect the above mentioned error. In accordance with the conventional parallel test method, an output of a 'high' level is always generated for semiconductor devices having a good quality. For this reason, the conventional parallel test method cannot be used for a test of checking device characteristics or for a speed sort test, which tests need either output of a 'high' or 'low' level.

SUMMARY OF THE INVENTION

Therefore, the present invention has been made in view of the above mentioned problems, and an object of the invention is to provide a parallel test circuit capable of conducting an accurate parallel test even when erroneous data is stored due to an erroneous operation.

Another object of the invention is to provide a parallel test circuit capable of accurately detecting errors involved in a semiconductor memory circuit, in which the parallel test circuit is incorporated, so that it can not only conduct a reliable parallel test for pass/fail devices, but also be used to check device characteristics or for a speed sort test.

In accordance with the present invention, these objects are accomplished by providing a parallel test circuit for a semiconductor memory device comprising a data input pad, to which data to be written is inputted, a plurality of cell arrays each consisting of a plurality of memory cells each adapted to store the data inputted to the data input pad, and a data output pad for outputting the stored data when the stored data is to be read, further comprising: a main output driver for, when the cell arrays are stored with data having the same level, respectively, outputting a signal having the same level as the stored data; a sub output driver for, when the cell arrays are stored with data having different levels, respectively, outputting a signal having an intermediate level; a main output driver control unit activated by an output enable signal and adapted to control the main output driver in accordance with the levels of the data stored in the cell arrays; and a sub output driver control unit activated by the output enable signal and adapted to control the sub output driver in accordance with the levels of the data stored in the cell arrays.

In accordance with an embodiment of the present invention, the intermediate level corresponds to a low impedance level.

In accordance with an embodiment of the present invention, the intermediate level corresponds to half the level of a supply voltage.

In accordance with an embodiment of the present invention, the main output driver has a current capacity higher than that of the sub output driver.

In accordance with an embodiment of the present invention, the parallel test circuit further comprises delay means for floating the sub output driver after the sub output driver outputs data for a desired period of time, thereby cutting off the outputting of data from the sub output driver.

In accordance with an embodiment of the present invention, the sub output driver control unit comprises first comparing means for comparing data outputted from the sub output driver with a first reference voltage, thereby outputting a first sub driving signal, and second comparing means for comparing the data outputted from the sub output driver with a second reference voltage, thereby outputting a second sub driving signal, the first and second comparing means being activated by a combination of the output enable signal with a combination of the data respectively stored in the cell arrays.

In accordance with an embodiment of the present invention, each of the first and second comparing means is a current mirror type sense amplifier.

In accordance with an embodiment of the present invention, the first reference voltage has a level corresponding to 0.54 times the level of a supply voltage, and the second reference voltage has a level corresponding to 0.32 times the supply voltage level.

BRIEF DESCRIPTION OF THE DRAWINGS

Other objects and aspects of the invention will become apparent from the following description of embodiments with reference to the accompanying drawings in which:

FIG. 2 is a schematic view illustrating a truth table associated with the circuit of FIG. 1;

FIG. 4 is a schematic view illustrating a truth table associated with the circuit of FIG. 3;

FIG. 6 is a schematic view illustrating a truth table associated with the circuit of FIG. 5;

FIG. 9 is a schematic view illustrating a truth table associated with the circuit of FIG. 8;

FIG. 11 is a schematic view illustrating a truth table associated with the circuit of FIG. 10;

FIG. 13 is a schematic view illustrating a truth table associated with the circuit of FIG. 12.

DESCRIPTION OF THE PREFERRED EMBODIMENTS

Figure 1:
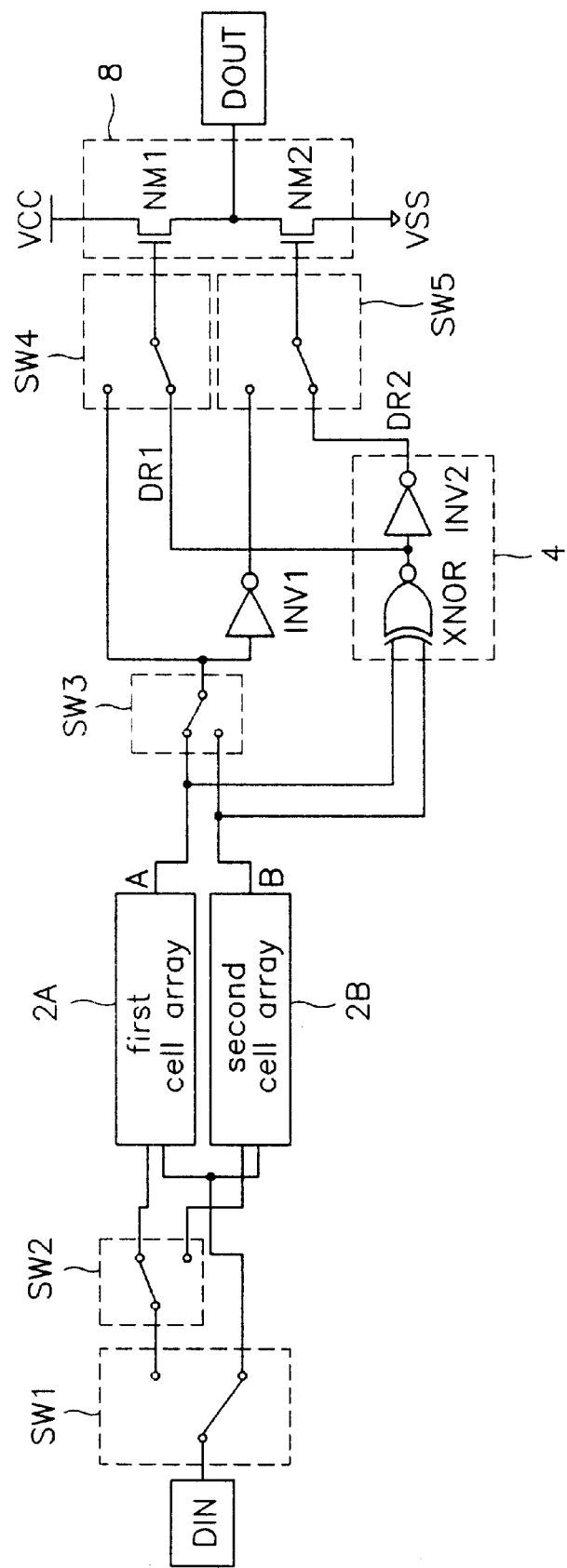
FIG. 1 is a circuit diagram illustrating a conventional parallel test circuit.

In the drawings, the same constituting elements are denoted by the same reference numerals.

Figure 3:
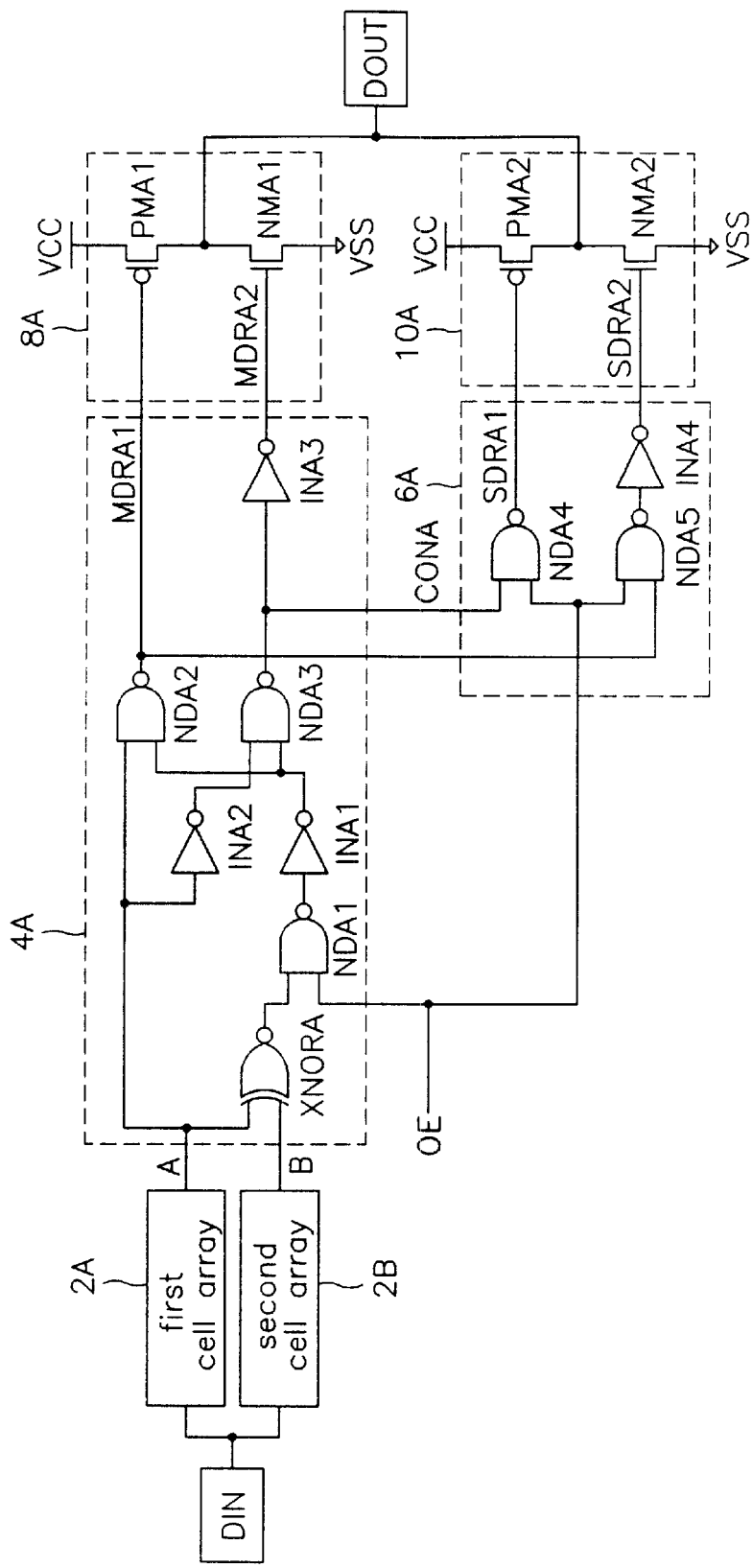
FIG. 3 is a circuit diagram illustrating a parallel test circuit for a semiconductor memory device in accordance with a first embodiment of the present invention.

Referring to FIG. 3, a parallel test circuit for a semiconductor memory device in accordance with a first embodiment of the present invention is illustrated. In FIG. 3, no normal mode data path is illustrated in order to more clearly illustrate a test mode data path.

As shown in FIG. 3, the parallel test circuit includes a data input pad DIN, to which data to be written is inputted, and a pair of cell arrays, that is, a first cell array 2A and a second cell array 2B, each consisting of a plurality of memory cells each adapted to store the data inputted to the data input pad DIN. Also, there are provided a main output driver 8A which includes a first PMOS transistor PMA1 and a first NMOS transistor NMA1 coupled in series between a supply voltage Vcc and a ground voltage Vss, and a sub output driver 10A which includes a second PMOS transistor PMA2 and a second NMOS transistor NMA2 coupled in series between the supply voltage Vcc and the ground voltage Vss. The parallel test circuit also includes a main output driver control unit 4A for outputting first and second main driving signal MDRA1 and MDRA2 adapted to drive the main output driver 8A, along with an output signal CONA, based on respective output data signals A and B from the first and second cell arrays 2A and 2B, a sub output driver control unit 6A activated by an output enable signal OE and adapted to output first and second sub driving signals SDRA1 and SDRA2 to drive the sub output driver 10A, based on the first main driving signal MRA1 and output signal CONA from the main output driver control unit 4A, and a data output pad DOUT for externally outputting output data from the main output driver 8A or sub output driver 10A when the data is to be read.

The main output driver control unit 4A includes an exclusive NOR gate XNORA for exclusively NORing respective output data A and B from the first and second cell arrays 2A and 2B, a first NAND gate NDA1 for NORing the output from the exclusive NOR gate XNORA with the output enable signal OE, a first inverter INA1 for inverting the output from the first NAND gate NDA1, and a second inverter INA2 for inverting the output data A from the first cell array 2A. The main output driver control unit 4A also includes a second NAND gate NDA2 for NORing the output data A from the first cell array 2A with the output from the first inverter INA1, and outputting the resultant signal as the first main driving signal MDRA1, a third NAND gate NDA3 for NORing the outputs from the first and second inverters INA1 and INA2, and outputting the resultant signal as the output signal CONA, and a third inverter INA3 for inverting the output from the third NAND gate NDA3, and outputting the inverted signal as the second main driving signal MDRA2.

The sub output driver control unit 6A includes a fourth NAND gate NDA4 for NORing the output enable signal OE with the output signal CONA from the main output driver control unit 4A, and outputting the resultant signal as the first sub driving signal SDRA1, a fifth NAND gate NDA5 for NORing the output enable signal OE with the first main driving signal MDRA1 from the main output driver control unit 4A, and a fourth inverter INA4 for inverting the output from the fifth NAND gate NDA5, and outputting the inverted signal as the second sub driving signal SDRA2.

The configuration of FIG. 3 is characterized by an output driver configuration which is divided into the main output driver 8A and the sub output driver 10A adapted to generate a tri-state output under the control of the main and sub output drivers 8A and 10A, based on the output data A and B from the first and second cell arrays 2A and 2B along with the output enable signal OE, respectively.

Now, the operation of he parallel test circuit of FIG. 3 according to the illustrated embodiment of the present invention will be described.

Figure 4:
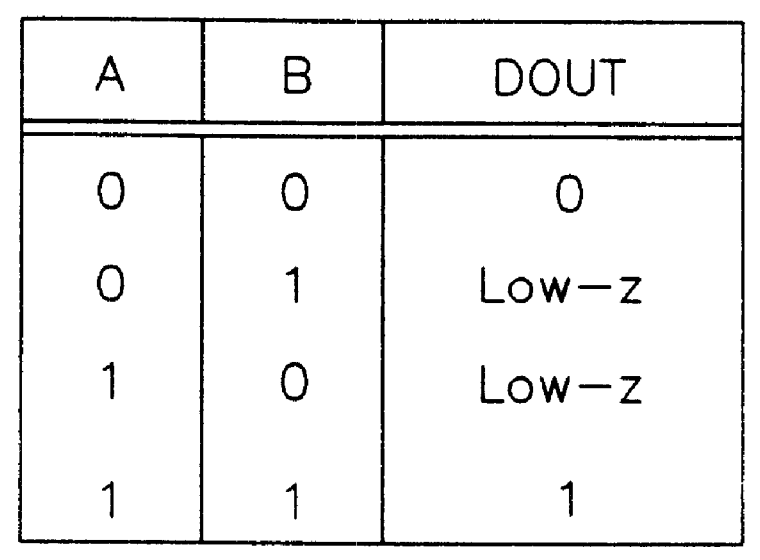

The output conditions of the divided output drivers associated with three output levels of a tri-state output generated in a parallel test mode will be described in conjunction with FIG. 4. Where both the output data A and B from the first and second cell arrays 2A and 2B parallel-accessed in the parallel test mode have a value of '1', respectively, both the first PMOS transistor PMA1 of the main output driver 8A and the second PMOS transistor PMA2 of the sub output driver 10A are turned on. In this state, both the first NMOS transistor NMA1 of the main output driver 8A and the second NMOS transistor NMA2 of the sub output driver 10A are turned off. As a result, the final output data from the parallel test circuit has a value of '1', namely, a logic 'high' level. On the other hand, where both the output data A and B from the first and second cell arrays 2A and 2B have a value of '0', respectively, both the first PMOS transistor PMA1 of the main output driver 8A and the second PMOS transistor PMA2 of the sub output driver 10A are turned off. In this state, both the first NMOS transistor NMA1 of the main output driver 8A and the second NMOS transistor NMA2 of the sub output driver 10A are turned on. As a result, the final output data from the parallel test circuit has a value of '0', namely, a logic 'low' level. Thus, when the output data A and B from the parallel-accessed first and second cell arrays 2A and 2B have the same value, the final output data has the same value as those stored data. However, where the output data A and B from the parallel-accessed first and second cell arrays 2A and 2B have different values from each other, for example, values of '0' and '1' or values of '1' or '0', respectively, both the first PMOS transistor PMA1 and first NMOS transistor NMA1 of the main output driver 8A are turned off, so that the main output driver 8A is rendered to be in a floating state, namely, a high impedance state Hi-z. In this case, both the second PMOS transistor PMA2 and second NMOS transistor NMA2 of the sub output driver 10A are turned on, thereby causing the sub output driver 10A to generate an output having a low impedance level Low-z. As a result, the final output data from the parallel test circuit has a low impedance level corresponding to about half the level of the supply voltage Vcc (½ Vcc). Thus, where the output data A and B from the parallel-accessed first and second cell arrays 2A and 2B have different values from each other, data is outputted which has neither the high nor low level, but has the low impedance level corresponding to about half the level of the supply voltage Vcc (½ Vcc), as shown in the truth table of FIG. 4.

The parallel test circuit according to the illustrated embodiment of the present invention provides an advantage in that it makes it possible to apply a speed binning to tests for high speed memory devices such as synchronous DRAMs. This is because the parallel test circuit outputs a signal having a low impedance level when an error occurs, so that the resultant output level switching operation to the high impedance level Hi-z can be carried out at a speed considerably higher than that of an output level switching operation resulting from a pure floating.

In the above mentioned configuration of FIG. 3, however, a temporal short circuit may occur between the system power supply Vcc and the ground Vss when both the second PMOS transistor PMA2 and second NMOS transistor NMA2 of the sub output driver 10A turn on. Such a temporal short circuit may damage both the test system and the semiconductor device coupled to the test system. In order to solve this problem, the main and sub output drivers 8A and 10A have different current capacities in such a fashion that the current capacity of the main output driver 8A is higher than that of the sub output driver 10A in accordance with the present invention. Accordingly, it is possible to ensure a stability against the damage of the test system or semiconductor device which may occur due to a short circuit between the system power and the ground during an operation conducted in the parallel test mode.

As apparent from the above description, the parallel test circuit according to the illustrated embodiment of the present invention has a divided output driver configuration capable of generating, in the parallel test mode, a tri-state output having a level corresponding to one of three levels, that is, 'high', 'low', and 'low impedance' levels. When all data from parallel-accessed cell arrays have the same level, the parallel test circuit generates an output having the same data level (a 'high'or 'low' level) as that stored in those cell arrays. Where data from even one of the parallel-accessed cell arrays is different from those of the remaining cell arrays, the parallel test circuit generates an output having a low impedance level corresponding to about half the supply voltage level. Based on the output level, accordingly, it is possible to identify whether or not each cell is stored with correct data. For instance, where cells, which are parallel-accessed to be written with data of '1', are erroneously stored with data of '0', the parallel test circuit, which has the divided output driver configuration according to the illustrated embodiment of the present invention, generates an output of a 'low' level, namely, '0'. In this case, the semiconductor device is regarded as to have failed, based on the output of '0' from the parallel test circuit. Thus, the parallel test circuit of the present invention can detect errors which cannot be detected by the conventional parallel test circuit.

Figure 5:
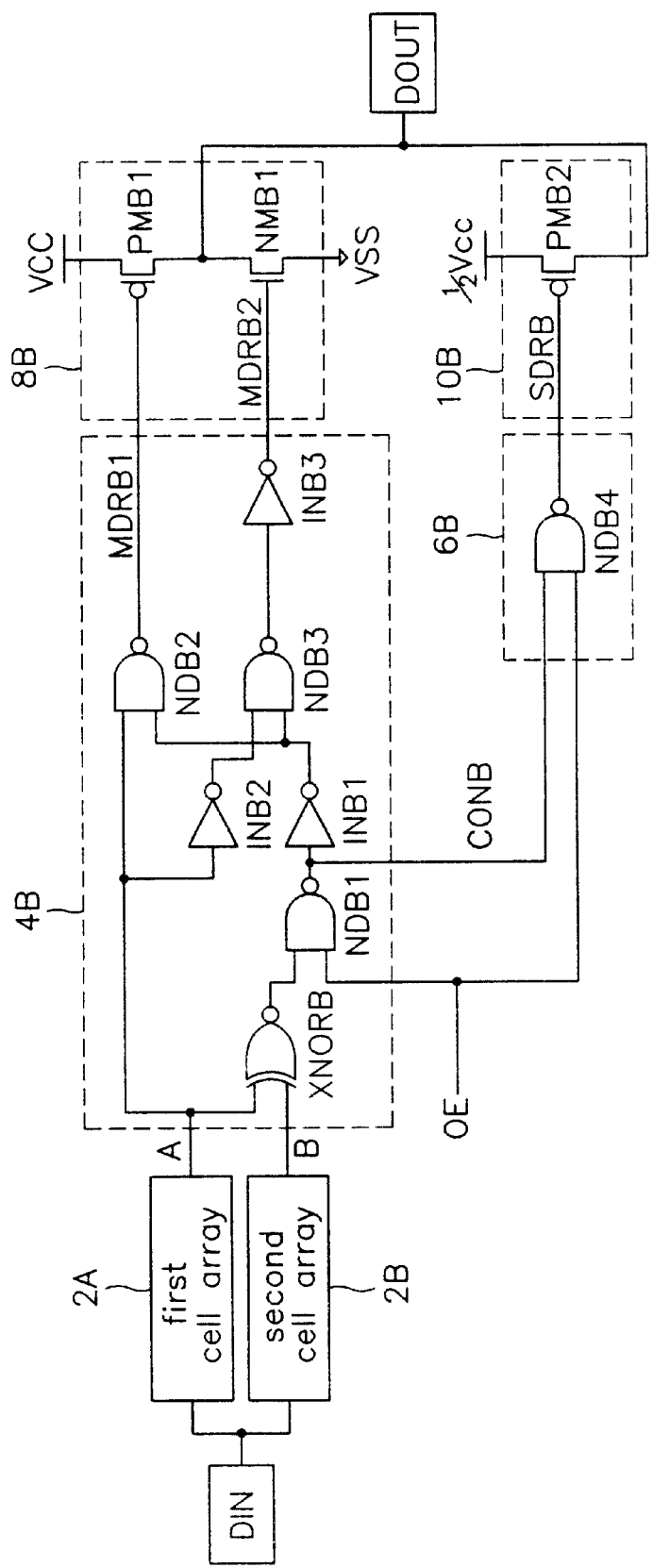
FIG. 5 is a circuit diagram illustrating a parallel test circuit for a semiconductor memory device in accordance with a second embodiment of the present invention.

FIG. 5 is a circuit diagram illustrating a parallel test circuit for a semiconductor memory device in accordance with a second embodiment of the present invention.

As shown in FIG. 5, this parallel test circuit includes a data input pad DIN, to which data to be written is inputted, and a pair of cell arrays, that is, a first cell array 2A and a second cell array 2B, each consisting of a plurality of memory cells each adapted to store the data inputted to the data input pad DIN. Also, there are provided a main output driver 8B which includes a first PMOS transistor PMB1 and a first NMOS transistor NMB1 coupled in series between a supply voltage Vcc and a ground voltage Vss, and a sub output driver 10B which includes a second PMOS transistor PMA2 adapted to receive a source voltage corresponding to half the supply voltage Vcc (½ Vcc). The parallel test circuit also includes a main output driver control unit 4B for outputting first and second main driving signals MDRB1 and MDRB2 adapted to drive the main output driver 8B, along with a signal CONB, based on respective output data signals A and B from the first and second cell arrays 2A and 2B, a sub output driver control unit 6B activated by an output enable signal OE and adapted to output a sub driving signal SDRB to drive the sub output driver 10B, based on the first main driving signal MRB1 and output signal CONB from the main output driver control unit 4B, and a data output pad DOUT for externally outputting output data from the main output driver 8B or sub output driver 10B when the data is to be read.

The main output driver control unit 4B includes an exclusive NOR gate XNORB for exclusively NORing respective output data A and B from the first and second cell arrays 2A and 2B, a first NAND gate NDB1 for NORing the output from the exclusive NOR gate XNORB with the output enable signal OE, and outputting the resultant signal as the output signal CONB, a first inverter INB1 for inverting the output from the first NAND gate NDB1, and a second inverter INB2 for inverting the output data A from the first cell array 2A. The main output driver control unit 4B also includes a second NAND gate NDB2 for NORing the output data A from the first cell array 2A with the output from the first inverter INB1, and outputting the resultant signal as the first main driving signal MDRB1, a third NAND gate NDB3 for NORing the outputs from the first and second inverters INB1 and INB2, and a third inverter INB3 for inverting the output from the third NAND gate NDB3, and outputting the inverted signal as the second main driving signal MDRB2.

The sub output driver control unit 6B includes a fourth NAND gate NDB4 for NORing the output enable signal OE with the output signal CONB from the main output driver control unit 4B, and outputting the resultant signal as the sub driving signal SDRB adapted to drive the sub output driver 10B.

The configuration of the parallel test circuit according to the second embodiment of the present invention is characterized in that the sub output driver 10B uses a source voltage corresponding to half the supply voltage (½ Vcc).

In the parallel test circuit of FIG. 5, when both the output data A and B from the first and second cell arrays 2A and 2B have the same value, the main output driver 8B outputs a signal having a 'low' or 'high' level. In this state, the sub output driver 10B turns off. As a result, the output data from the parallel test circuit has a level corresponding to the output level of the main output driver 8B. On the other hand, where the output data A and B from the first and second cell arrays 2A and 2B have different levels from each other, the main output driver 8B is rendered to be in a floating state Hi-z. In this state, the sub driver 10B turns on. As a result, the final output data from the parallel test circuit has a level corresponding to half the level of the supply voltage (½ Vcc level). This is apparent from FIG. 6 illustrating the truth table associated with the configuration of FIG. 5.

Figure 7:
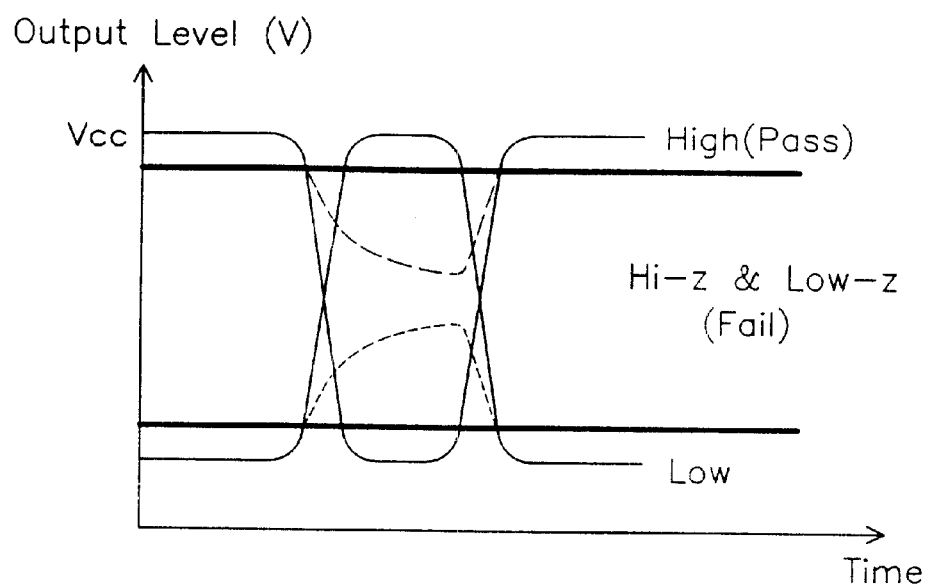
FIG. 7 is a waveform diagram illustrating the level of a tri-state output from the circuit of FIG. 5.

FIG. 7 is a waveform diagram illustrating the level of a tri-state output from the circuit shown in FIG. 5.

Figure 8:
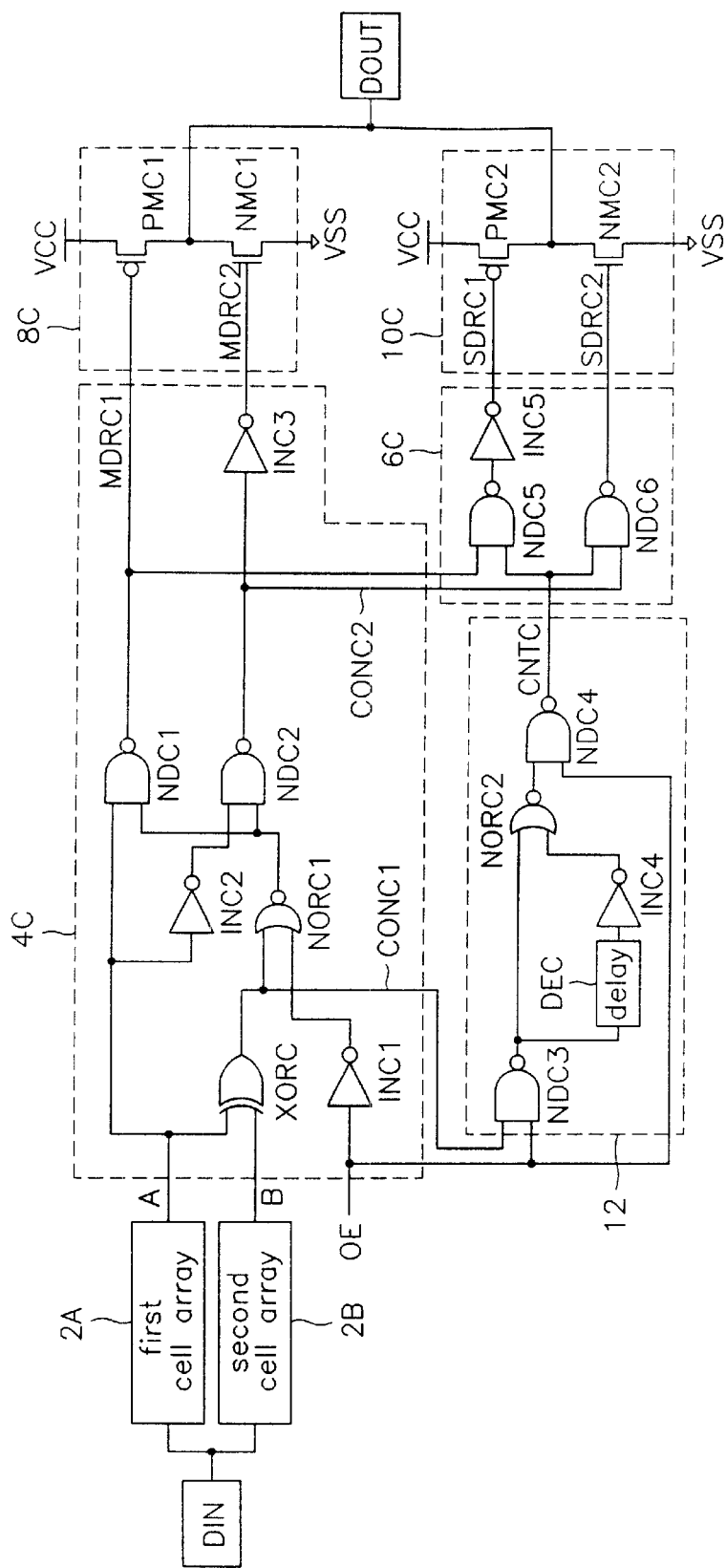
FIG. 8 is a circuit diagram illustrating a parallel test circuit for a semiconductor memory device in accordance with a third embodiment of the present invention.

FIG. 8 is a circuit diagram illustrating a parallel test circuit for a semiconductor memory device in accordance with a third embodiment of the present invention.

As shown in FIG. 8, this parallel test circuit includes a data input pad DIN, to which data to be written is inputted, and a pair of cell arrays, that is, a first cell array 2A and a second cell array 2B, each consisting of a plurality of memory cells each adapted to store the data inputted to the data input pad DIN. Also, there are provided a main output driver 8C which includes a first PMOS transistor PMC1 and a first NMOS transistor NMC1 coupled in series between a supply voltage Vcc and a ground voltage Vss, and a sub output driver 10C which includes a second PMOS transistor PMC2 and a second NMOS transistor NMC2 coupled in series between the supply voltage Vcc and the ground voltage Vss. The parallel test circuit also includes a main output driver control unit 4C activated by an output enable signal OE and adapted to output first and second main driving signals MDRC1 and MDRC2 adapted to drive the main output driver 8C, along with first and second output signals CONC1 and CONC2, based on respective output data signals A and B from the first and second cell arrays 2A and 2B. The parallel test circuit further includes a delay unit 12 controlled by the first output signal CONC1 from the main output driver control unit 4C and adapted to control a sub output driver control unit 6C. The sub output driver control unit 6C, which is also included in the parallel test circuit, is controlled by a control signal CNTC generated from the delay unit 12. The sub output driver control unit 6C serves to output first and second sub driving signals SDRC1 and SDRC2 adapted to drive the sub output driver 10C, based on the first main driving signal MDRC1 and the first and second output signals CONC1 and CONC2 from the main output driver control unit 4A. The parallel test circuit further includes a data output pad DOUT for externally outputting output data from the main output driver 8C or sub output driver 10C when the data is to be read.

The main output driver control unit 4C includes an exclusive OR gate XORC for exclusively ORing respective output data A and B from the first and second cell arrays 2A and 2B, and outputting the resultant signal as the first output signal CONC1, a first inverter INC1 for inverting the output enable signal OE, a first NOR gate NORC1 for NORing the output from the exclusive OR gate XORC with the output from the first inverter INC1, and a second inverter INC2 for inverting the output data A from the first cell array 2A. The main output driver control unit 4C also includes a first NAND gate NDC1 for NANDing the output data A from the first cell array 2A with the output from the first NOR gate NORC1, and outputting the resultant signal as the first main driving signal MDRC1, a second NAND gate NDC2 for NANDing the output from the second inverter INC2 with the output from the first NOR gate NORC1, and outputting the resultant signal as the second output signal CONC2, and a third inverter INC3 for inverting the second output signal CONC2 from the second NAND gate NDC2, and outputting the resultant signal as the second main driving signal MDRC2.

The delay unit 12 includes a third NAND gate NDC3 for NANDing the first output signal CONC1 from the main output driver control unit 4C with the output enable signal OE, a delay DEC for delaying the output from the third NAND gate NDC3 for a desired period of time, and a fourth inverter INC4 for inverting the output from the delay DEC. The delay unit 12 also includes a second NOR gate NORC2 for NORing the output from the fourth inverter INC4 with the output from the third NAND gate NDC3, and a fourth NAND gate NDC4 for NANDing the output from the second NOR gate NORC2 with the output enable signal OE, and outputting the resultant signal as the control signal CNTC.

The sub output driver control unit 6C includes a fifth NAND gate NDC5 for NORing the first main driving signal MDRC1 with the control signal CNTC, a fifth inverter INC5 for inverting the output from the fifth NAND gate NDC5, and outputting the resultant signal as the first sub driving signal SDRC1, and a sixth NAND gate NDC6 for NANDing the second output signal CONC2 from the main output driver control unit 4C with the control signal CNTC, and outputting the resultant signal as the second sub driving signal SDRC2.

The parallel test circuit of FIG. 8 is characterized by a configuration in which the delay unit 12, which serves to control the outputting time of the sub output driver, is incorporated in the configuration of FIG. 3 according to the first embodiment of the present invention. Accordingly, the basic operation of the parallel test circuit of FIG. 8 is the same as that of FIG. 3. However, the parallel test circuit of FIG. 8 operates differently from that of FIG. 3 in that the delay unit 12 turns off the sub output driver 10C after the sub output driver 10C outputs a low impedance level Low-z for a desired period of time in response to a failure detected, without allowing the low impedance-level output from the sub output driver 10C to be maintained until the next data output is generated. That is, the low impedance-level output is cut off before the next data output is generated in the case of the parallel test circuit of FIG. 8. In this case, accordingly, it is possible to more or less reduce the consumption of current required to more rapidly detect a failure.

FIG. 9 is a truth table associated with the configuration of FIG. 8. Referring to FIG. 9, it can be found that the output data A and B of the first and second cell arrays 2A and 2B have different levels from each other, the second PMOS transistor PMC2 and second NMOS transistor NMC2 of the sub output driver 10C conduct different switching operations, respectively.

Figure 10:
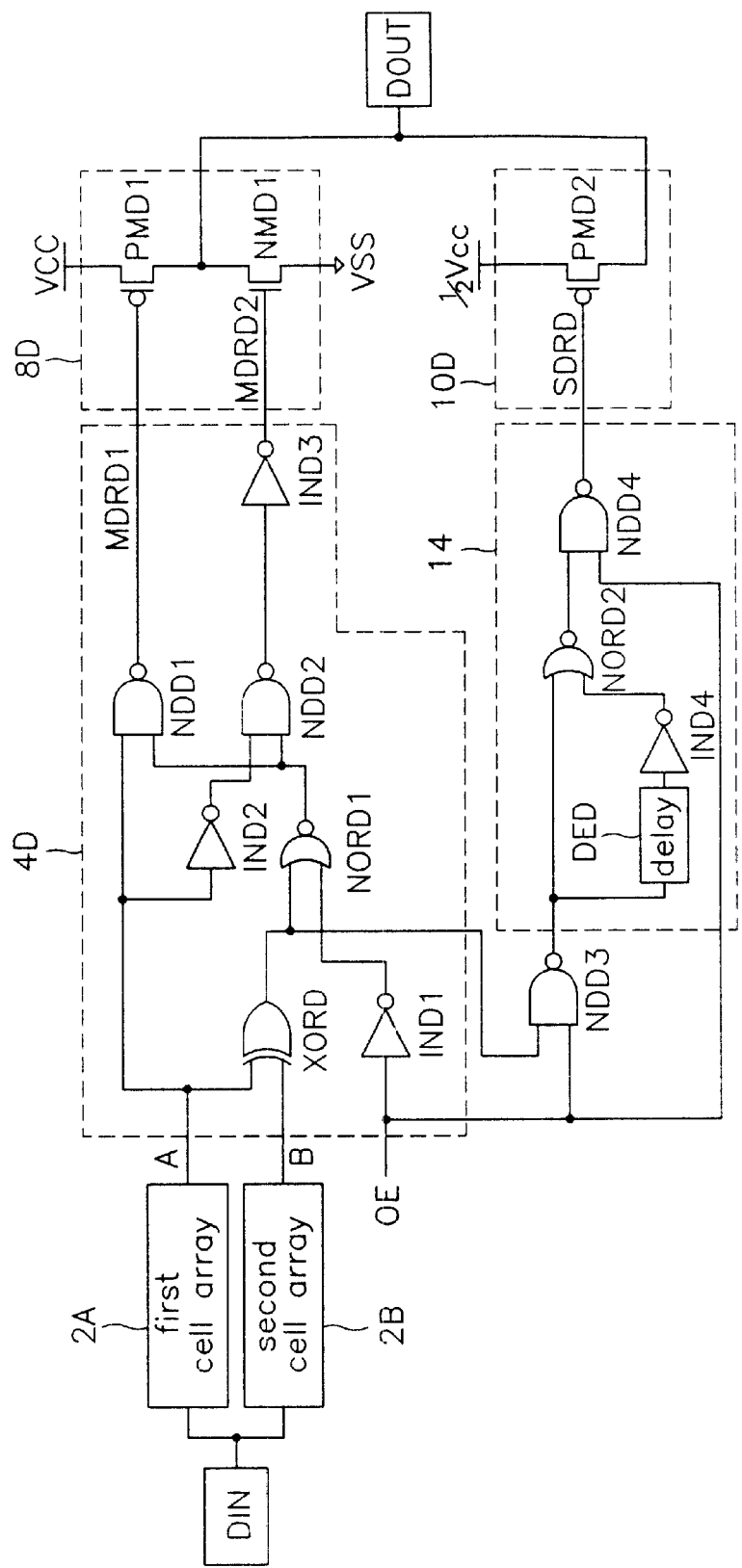
FIG. 10 is a circuit diagram illustrating a parallel test circuit for a semiconductor memory device in accordance with a fourth embodiment of the present invention.

FIG. 10 is a circuit diagram illustrating a parallel test circuit for a semiconductor memory device in accordance with a fourth embodiment of the present invention.

As shown in FIG. 10, this parallel test circuit includes a data input pad DIN, to which data to be written is inputted, and a pair of cell arrays, that is, a first cell array 2A and a second cell array 2B, each consisting of a plurality of memory cells each adapted to store the data inputted to the data input pad DIN. Also, there are provided a main output driver 8D which includes a first PMOS transistor PMD1 and a first NMOS transistor NMD1 coupled in series between a supply voltage Vcc and a ground voltage Vss, and a sub output driver 10D which includes a second PMOS transistor PMD2 adapted to receive a source voltage corresponding to half the supply voltage Vcc (½ Vcc). The parallel test circuit also includes a main output driver control unit 4D activated by an output enable signal OE and adapted to output first and second main driving signals MDRD1 and MDRD2 adapted to drive the main output driver 8D, along with an output signal COND, based on respective output data signals A and B from the first and second cell arrays 2A and 2B. The parallel test circuit further includes a delay unit 14 for generating a sub drive signal SDRD adapted to control the sub output driver 10D, based on the output signal COND from the main output driver control unit 4D, and a data output pad DOUT for externally outputting output data from the main output driver 8D or sub output driver 10D when the data is to be read.

The main output driver control unit 4D includes an exclusive OR gate XORD for exclusively ORing respective output data A and B from the first and second cell arrays 2A and 2B, and outputting the resultant signal as the output signal COND, a first inverter IND1 for inverting the output enable signal OE, a first NOR gate NORD1 for NORing the output from the exclusive OR gate XORD with the output from the first inverter IND1, and a second inverter IND2 for inverting the output data A from the first cell array 2A. The main output driver control unit 4D also includes a first NAND gate NDD1 for NANDing the output data A from the first cell array 2A with the output from the first NOR gate NORD1, and outputting the resultant signal as the first main driving signal MDRD1, a second NAND gate NDD2 for NANDing the output from the second inverter IND2 with the output from the first NOR gate NORD1, and a third inverter IND3 for inverting the output from the second NAND gate NDD2, and outputting the resultant signal as the second main driving signal MDRC2.

The delay unit 14 includes a third NAND gate NDD3 for NANDing the output signal COND from the main output driver control unit 4C with the output enable signal OE, a delay DED for delaying the output from the third NAND gate NDD3 for a desired period of time, and a fourth inverter IND4 for inverting the output from the delay DED. The delay unit 14 also includes a second NOR gate NORD2 for NORing the output from the fourth inverter IND4 with the output from the third NAND gate NDD3, and a fourth NAND gate NDD4 for NANDing the output from the second NOR gate NORD2 with the output enable signal OE, and outputting the resultant signal as the sub driving signal SDRD.

The parallel test circuit of FIG. 10 is characterized by a configuration in which the delay unit 14, which serves to control the outputting time of the sub output driver, is incorporated in the configuration of FIG. 5 according to the second embodiment of the present invention. Accordingly, the basic operation of the parallel test circuit of FIG. 10 is the same as that of FIG. 5. However, the parallel test circuit of FIG. 10 operates differently from that of FIG. 5 in that the delay unit 14 turns off the sub output driver 10C after the sub output driver 10D outputs a half supply voltage (½ Vcc) for a desired period of time in response to a failure detected, without allowing the half supply voltage output from the sub output driver 10D to be maintained until the next data output is generated. That is, the low impedance-level output is cut off before the next data output is generated in the case of the parallel test circuit of FIG. 10. In this case, accordingly, it is possible to more or less reduce the consumption of current required to more rapidly detect a failure.

FIG. 11 is a truth table associated with the configuration of FIG. 10. Referring to FIG. 11, it can be found that the output data A and B of the first and second cell arrays 2A and 2B have different levels from each other, the second PMOS transistor PMD2 of the sub output driver 10D conducts a different switching operation.

Figure 12:
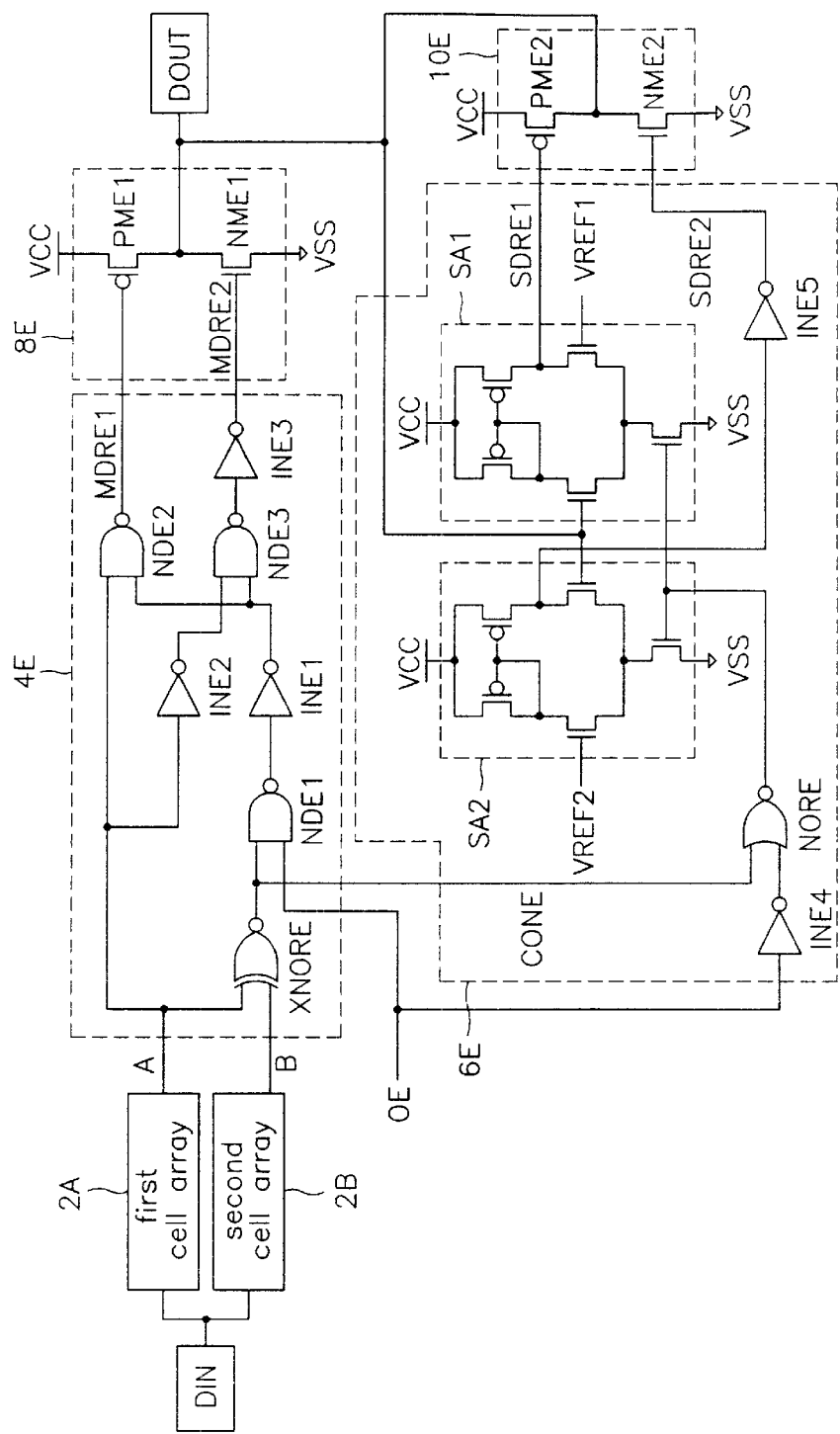
FIG. 12 is a circuit diagram illustrating a parallel test circuit for a semiconductor memory device in accordance with a fifth embodiment of the present invention.

FIG. 12 is a circuit diagram illustrating a parallel test circuit for a semiconductor memory device in accordance with a fifth embodiment of the present invention.

As shown in FIG. 12, the parallel test circuit includes a data input pad DIN, to which data to be written is inputted, and a pair of cell arrays, that is, a first cell array 2A and a second cell array 2B, each consisting of a plurality of memory cells each adapted to store the data inputted to the data input pad DIN. Also, there are provided a main output driver 8E which includes a first PMOS transistor PME1 and a first NMOS transistor NME1 coupled in series between a supply voltage Vcc and a ground voltage Vss, and a sub output driver 10E which includes a second PMOS transistor PME2 and a second NMOS transistor NME2 coupled in series between the supply voltage Vcc and the ground voltage Vss. The parallel test circuit also includes a main output driver control unit 4E for outputting first and second main driving signals MDRE1 and MDRE2 adapted to drive the main output driver 8E, along with an output signal CONE, based on respective output data signals A and B from the first and second cell arrays 2A and 2B, a sub output driver control unit 6E activated by an output enable signal OE and adapted to output first and second sub driving signals SDRE1 and SDRE2 to drive the sub output driver 10E, based on the output signal CONE from the main output driver control unit 4E, and a data output pad DOUT for externally outputting output data from the main output driver 8E or sub output driver 10E when the data is to be read.

The main output driver control unit 4E includes an exclusive NOR gate XNORE for exclusively NORing respective output data A and B from the first and second cell arrays 2A and 2B, and outputting the resultant signal as the output signal CONE, a first NAND gate NDE1 for NORing the output signal CONE from the exclusive NOR gate XNORE with the output enable signal OE, a first inverter INE1 for inverting the output from the first NAND gate NDE1, and a second inverter INE2 for inverting the output data A from the first cell array 2A. The main output driver control unit 4E also includes a second NAND gate NDE2 for NORing the output data A from the first cell array 2A with the output from the first inverter INE1, and outputting the resultant signal as the first main driving signal MDRE1, a third NAND gate NDE3 for NORing the outputs from the first and second inverters INE1 and INE2, and a third inverter INE3 for inverting the output from the third NAND gate NDE3, and outputting the inverted signal as the second main driving signal MDRE2.

The sub output driver control unit 6E includes a fourth inverter INE4 for inverting the output enable signal OE, a NOR gate NORE for NORing the output from the fourth inverter INE4 with the output signal CONE from the main output driver control unit 4E. The sub output driver control unit 6E also includes a first current mirror type sense amplifier SA1 activated by the output from the NOR gate NORE and adapted to compare the output data from the sub output driver 10E with a first reference voltage VREF1, thereby outputting a first sub driving signal SDRE1. The sub output driver control unit 6E further includes a second current mirror type sense amplifier SA2 activated by the output from the NOR gate NORE and adapted to compare the output data from the sub output driver 10E with a second reference voltage VREF2, thereby outputting a second sub driving signal SDRE2, and a fifth inverter INE5 for inverting the output from the second sense amplifier SA2, thereby outputting the second sub driving signal SDRE2.

The parallel test circuit of FIG. 13 operates as follows. That is, where both the output data A and B from the first and second cell arrays 2A and 2B have the same value, the main output driver 8E outputs a signal having a 'low' or 'high' level. In this state, the sub output driver 10E is in its OFF state. On the other hand, where the output data A and B from the first and second cell arrays 2A and 2B have different levels from each other, the main output driver 8E turns off. In this state, the sub driver 10E varies its state in accordance with the level of the output data. That is, when the output data has a 'high' level, the second NMOS transistor NME2 turns on, thereby causing the output data to decrease in level to a 'fail' range. On the other hand, when the output data has a 'low' level, the second PMOS transistor PME2 turns on, thereby causing the output data to increase in level to the 'fail' range.

The parallel test circuit of FIG. 12 supplies the first reference voltage VREF1 having a level corresponding to about 0.32 times the level of the supply voltage Vcc (0.32*Vcc) and the second reference voltage VREF2 having a level corresponding to about 0.54 times the level of the supply voltage Vcc (0.54*Vcc) as reference voltages for the current mirror, in order to allow the level of the output data to rapidly reach only the 'fail' range without being lowered further to the high impedance level, thereby reducing the current consumption. This can be apparent from the truth table of FIG. 13.

Figure 14:
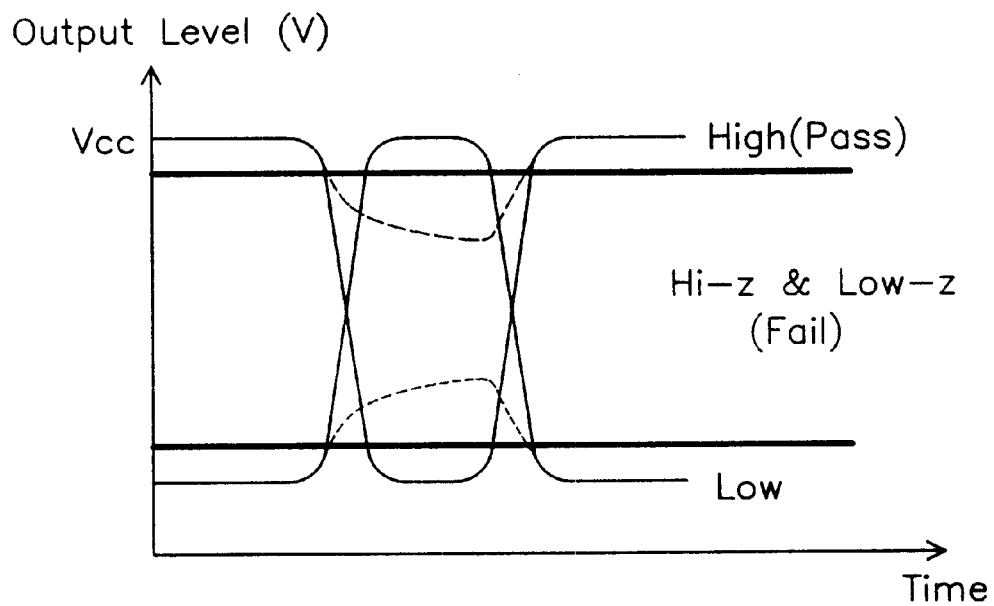
FIG. 14 is a waveform diagram illustrating a tri-state output generated from the circuit of FIG. 8, 10, or 12.

FIG. 14 is a waveform diagram illustrating a tri-state output generated from the parallel test circuit of FIG. 8, 10, or 12.

In the parallel test circuit of the present invention, the test time is reduced by a ½ rate corresponding a reduction rate of the number of 'Don't Care' address bits occurring in the test mode operation by virtue of the tri-state parallel test using the divided output driver configuration. In the test mode operation, an output is generated which has a level corresponding to the 'high', 'low', or 'intermediate' level. The 'intermediate' level may be a half supply voltage (½ Vcc), high impedance, or low impedance level. Accordingly, an improvement in fault coverage can be obtained. That is, in accordance with the present invention, it is possible to detect stuck faults, coupling faults, transition faults, pattern sensitive faults, a switching noise screening, and an invalid output data generation, all of which cannot be detected in the conventional test mode. In particular, the present invention provides a great improvement in association with characteristic checking and speed sorting.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

As apparent from the above description, the present invention provides a parallel test circuit capable of achieving an accurate parallel test even when data is erroneously stored due to an erroneous operation. In particulars the parallel test circuit of the present invention can accurately detect errors involved in a semiconductor memory device, in which the parallel test circuit is incorporated, so that it can not only conduct a reliable parallel test for pass/fail devices, but also be used to check device characteristics or for a speed sort test.

What is claimed is:

1. A parallel test circuit for a semiconductor memory device comprising a data input pad, to which data to be written is inputted, a plurality of cell arrays each consisting of a plurality of memory cells each adapted to store the data inputted to the data input pad, and a data output pad for outputting the stored data when the stored data is to be read, further comprising:

a main output driver for, when the cell arrays are stored with data having the same level, respectively, outputting a signal having the same level as the stored data;

a sub output driver for, when the cell arrays are stored with data having different levels, respectively, outputting a signal having an intermediate level;

a main output driver control unit activated by an output enable signal and adapted to control the main output driver in accordance with the levels of the data stored in the cell arrays; and a sub output driver control unit activated by the output enable signal and adapted to control the sub output driver in accordance with the levels of the data stored in the cell arrays.

2. The parallel test circuit in accordance with claim 1, wherein the intermediate level corresponds to a low impedance level.

3. The parallel test circuit in accordance with claim 1, wherein the intermediate level corresponds to half the level of a supply voltage.

4. The parallel test circuit in accordance with claim 1, wherein the main output driver has a current capacity higher than that of the sub output driver.

5. The parallel test circuit in accordance with claim 1, further comprising:

delay means for floating the sub output driver after the sub output driver outputs data for a desired period of time, thereby cutting off the outputting of data from the sub output driver.

6. The parallel test circuit in accordance with claim 1, wherein the sub output driver control unit comprises first comparing means for comparing data outputted from the sub output driver with a first reference voltage, thereby outputting a first sub driving signal, and second comparing means for comparing the data outputted from the sub output driver with a second reference voltage, thereby outputting a second sub driving signal, the first and second comparing means being activated by a combination of the output enable signal with a combination of the data respectively stored in the cell arrays.

7. The parallel test circuit in accordance with claim 6, wherein each of the first and second comparing means is a current mirror type sense amplifier.

8. The parallel test circuit in accordance with claim 6, wherein the first reference voltage has a level corresponding to 0.54 times the level of a supply voltage, and the second reference voltage has a level corresponding to 0.32 times the supply voltage level.

* * * * *